United States Patent
Zheng et al.

(10) Patent No.: US 7,936,598 B2
(45) Date of Patent: May 3, 2011

(54) MAGNETIC STACK HAVING ASSIST LAYER

(75) Inventors: Yuankai Zheng, Bloomington, MN (US); Zheng Gao, San Jose, CA (US); Wonjoon Jung, Bloomington, MN (US); Xuebing Feng, Chanhassen, MN (US); Xiaohua Lou, Bloomington, MN (US); Haiwen Xi, Prior Lake, MN (US)

(73) Assignee: Seagate Technology, Scotts Valley, CA (US)

( * ) Notice: Subject to any disclaimer, the term of this patent is extended or adjusted under 35 U.S.C. 154(b) by 101 days.

(21) Appl. No.: 12/431,162

(22) Filed: Apr. 28, 2009

(65) Prior Publication Data

US 2010/0271870 A1 Oct. 28, 2010

(51) Int. Cl.
*G11C 11/15* (2006.01)

(52) U.S. Cl. .................................. 365/173; 365/171

(58) Field of Classification Search .............. 365/22, 365/55
See application file for complete search history.

(56) References Cited

U.S. PATENT DOCUMENTS

| | | | |
|---|---|---|---|
| 6,462,919 B1 | 10/2002 | Mack | |
| 6,650,513 B2 | 11/2003 | Fullerton | |
| 6,714,444 B2 | 3/2004 | Huai | |
| 6,819,532 B2 | 11/2004 | Kamijo | |
| 6,829,161 B2 | 12/2004 | Huai | |
| 6,838,740 B2 | 1/2005 | Huai | |
| 6,847,547 B2 | 1/2005 | Albert | |
| 6,888,742 B1 | 5/2005 | Nguyen | |
| 6,933,155 B2 | 8/2005 | Albert | |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 * | 9/2006 | Huai et al. | 365/171 |
| 7,126,202 B2 | 10/2006 | Huai | |
| 7,161,829 B2 | 1/2007 | Huai | |
| 7,170,778 B2 | 2/2007 | Kawai | |
| 7,190,611 B2 | 3/2007 | Nguyen | |
| 7,201,977 B2 | 4/2007 | Li | |
| 7,230,845 B1 | 6/2007 | Wang | |
| 7,233,039 B2 | 6/2007 | Huai | |
| 7,241,631 B2 | 7/2007 | Huai | |
| 7,241,632 B2 | 7/2007 | Yang | |
| 7,242,045 B2 | 7/2007 | Nguyen | |
| 7,242,048 B2 | 7/2007 | Huai | |
| 7,245,462 B2 | 7/2007 | Huai | |
| 7,313,013 B2 | 12/2007 | Sun | |
| 7,369,427 B2 | 5/2008 | Diao | |
| 7,394,248 B1 | 7/2008 | Guo | |

(Continued)

OTHER PUBLICATIONS

PCT Search Report and Written Opinion dated Jul. 21, 2010.

(Continued)

*Primary Examiner* — Tan T. Nguyen
(74) *Attorney, Agent, or Firm* — Campbell Nelson Whipps LLC

(57) ABSTRACT

A magnetic memory cell having a ferromagnetic free layer and a ferromagnetic pinned reference layer, each having an out-of-plane magnetic anisotropy and an out-of-plane magnetization orientation and switchable by spin torque. The cell includes a ferromagnetic assist layer proximate the free layer, the assist layer having a low magnetic anisotropy less than about 500 Oe. The assist layer may have in-plane or out-of-plane anisotropy.

20 Claims, 2 Drawing Sheets

U.S. PATENT DOCUMENTS

| | | | |
|---|---|---|---|
| 7,430,135 | B2 | 9/2008 | Huai |
| 7,432,574 | B2 * | 10/2008 | Nakamura et al. ............ 257/421 |
| 7,486,551 | B1 | 2/2009 | Li |
| 7,486,552 | B2 | 2/2009 | Apalkov |
| 7,489,541 | B2 | 2/2009 | Pakala |
| 7,518,835 | B2 | 4/2009 | Huai |
| 7,531,882 | B2 | 5/2009 | Nguyen |
| 7,576,956 | B2 | 8/2009 | Huai |
| 2005/0135020 | A1 | 6/2005 | Sugita et al. |
| 2005/0185455 | A1 | 8/2005 | Huai |
| 2005/0201023 | A1 | 9/2005 | Huai |
| 2006/0132990 | A1 | 6/2006 | Morise |
| 2006/0187705 | A1 | 8/2006 | Nakamura |
| 2006/0203503 | A1 | 9/2006 | Casenave |
| 2007/0008661 | A1 | 1/2007 | Min |
| 2007/0048485 | A1 | 3/2007 | Jogo |
| 2007/0054450 | A1 | 3/2007 | Hong |
| 2007/0063237 | A1 | 3/2007 | Huai |
| 2007/0086121 | A1 | 4/2007 | Nagase |
| 2007/0096229 | A1 | 5/2007 | Yoshikawa |
| 2007/0097734 | A1 | 5/2007 | Min |
| 2007/0120210 | A1 | 5/2007 | Yuan |
| 2007/0176251 | A1 | 8/2007 | Oh |
| 2007/0188942 | A1 | 8/2007 | Beach |
| 2007/0252186 | A1 | 11/2007 | Yang |
| 2008/0062578 | A1 | 3/2008 | Watanabe |
| 2008/0088980 | A1 | 4/2008 | Kitagawa |
| 2008/0165453 | A1 | 7/2008 | Kaiser |
| 2008/0230819 | A1 | 9/2008 | Nguyen |
| 2008/0273380 | A1 | 11/2008 | Diao |
| 2008/0310213 | A1 | 12/2008 | Chen |
| 2008/0310219 | A1 | 12/2008 | Chen |
| 2009/0050991 | A1 | 2/2009 | Nagai |
| 2009/0079018 | A1 | 3/2009 | Nagase et al. |
| 2009/0237987 | A1 * | 9/2009 | Zhu et al. ...................... 365/171 |
| 2009/0302403 | A1 | 12/2009 | Nguyen |

OTHER PUBLICATIONS

Sbbia, Rachid et al., Spin Transfer Switching Enhancement in Perpendicular Anisotropy Magnetic Tunnel Junctions with a Canted in-Plan Spin Polarizer, Journal of Applied Physics, American Institute of Physics, New York, U.S. LNKD-DOI:10.1063/1.3055373, vol. 105, No. 1., Jan. 6, 2009, pp. 13910, XP012119458.

U.S. Appl. No. 12/248,237, filed Oct. 9, 2008, Inventor: Zhu.

U.S. Appl. No. 12/326,274, filed Dec. 2, 2008, Inventor: Dimitrov.

U.S. Appl. No. 12/398,214, filed Mar. 5, 2009, Inventor: Wang.

J.C. Slonczewski, Current-Driven Excitation of Magnetic Multilayers, J. of Magnetism and Magnetic Materials 159 (1996) L1-L7.

L. Berger, Physic Rev. B 54, 9353 (1996).

J. Z. Sun, Spin-Current Interaction with Monodomain Magnetic Body: A Model Study, Physical Review B, vol. 62, No. 1, pp. 570-578 (2000).

Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Electron Devices Meeting, IEDM Technical Digest, 2005, pp. 459-462, IEEE.

Jiang et al., "Temperature Dependence of Current-Induced Magnetization Switching in Spin Valves with a Ferromagnetic CoGd Free Layer" Phys. Rev. Lett. 97, 217202 (2006).

Li et al., "Effects of MgO tunnel barrier thickness on magnetohysteresis in perpendicularly magnetized magnetic tunnel junctions of GdFeCo/FeCo/MgO/FeCo/TbFe/Co" *J. Appl. Phys. 99*, 08T310 (2006).

Mangin, D. Ravelosona, J. A. Katine, J. J. Carey, B. D. Terris and E. E. Fullerton, "Current-induced magnetization reversal in nanopillars with perpendicular anisotropy," Nature Materials, 2006, pp. 210-215, vol. 5, Nature Publishing Group.

Meng et al., "Spin transfer in nanomagnetic devices with perpendicular anisotropy" J. Appl. Phys. 99, 08G519 (2006).

Miura, T. Kawahara, R. Takemura, J. Hayakawa, S. Ikeda, R. Sasaki, H. Takahashi, H. Matsuoka and H. Ohno, "A novel SPRAM (SPin-transfer torque RAM) with a synthetic ferrimagnetic free layer for higher immunity to read disturbance and reducing write-current dispersion," 2007 Symposium on VLSI, Technology Digest of Technical Papers, pp. 234-235.

Nakayama et al., "Spin transfer switching in TbCoFe/CoFeB/MgO/CoFeB/TbCoFe magnetic tunnel junctions with perpendicular magnetic anisotropy" J. Appl Phys. vol. 103, 07A710 (2008).

Nishimura et al., "Magnetic tunnel junction device with perpendicular magnetization films for high-density magnetic random access memory" J. Appl. Phys. 91, 5246 (2002).

Ohmori, H. et al., Perpendicular Magnetic Tunnel Junction with Tunneling Magnetoresistance Ratio of 64% Using MgO (100) Barrier Layer Prepared at Room Temperature, *Journal of Applied Physics*, 103, 07A911 (2008).

PCT Search Report and Written Opinion dated Jul. 21, 2010, Our Ref; 14962WO00.

Sbbia, Rachid et al., Spin Transfer Switching Enhancement in Perpendicular Anisotropy Magnetic Tunnel Junctions with a Canted in-Plan Spin Polarizer, Journal of Applied Physics, American Institute of Physics, New York, U.S. LNKD-DOI:10.1063/1.3055373, vol. 105, No. 1., Jan. 6, 2009, pp. 13910, XP012119458.

U.S. Appl. No. 12/233/764 Gao et al., filed Sep. 19, 2008.

U.S. Appl. No. 12/269,537 Tang et al., filed Nov. 12, 2008.

U.S. Appl. No. 12/248,237, filed Oct. 9, 2008, Inventor: Zhu.

Xi, Haiwen and Robert M. White, Antiferromagnetic Thickness Dependence of Exchange Biasing, Physical Review B, vol. 61, No. 1, Jan. 1, 2000-1.

* cited by examiner

MAGNETIC STACK HAVING ASSIST LAYER

BACKGROUND

Fast growth of the pervasive computing and handheld/communication industry has generated exploding demand for high capacity nonvolatile solid-state data storage devices and rotating magnetic data storage device. Current technology like flash memory has several drawbacks such as slow access speed, limited endurance, and the integration difficulty. Flash memory (NAND or NOR) also faces scaling problems. Also, traditional rotating storage faces challenges in areal density and in making components like reading/recording heads smaller and more reliable.

Resistive sense memories (RSM) are promising candidates for future nonvolatile and universal memory by storing data bits as either a high or low resistance state. One such memory, magnetic random access memory (MRAM), features nonvolatility, fast writing/reading speed, almost unlimited programming endurance and zero standby power.

The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

However, many yield-limiting factors must be overcome before such magnetic memory stacks can reliable be used as memory devices or field sensors. Therefore, magnetic memory stacks with decreased switching current and increased thermal stability are desired.

BRIEF SUMMARY

The present disclosure relates to magnetic cells, such as a spin torque memory cell or magnetic tunnel junction cell, that have magnetic anisotropies and magnetization orientations of the associated ferromagnetic layers aligned perpendicular to the wafer plane or "out-of-plane". The cells include an assist layer.

One particular embodiment of this disclosure is a magnetic cell having a ferromagnetic free layer and a ferromagnetic pinned reference layer, each having an out-of-plane magnetic anisotropy and an out-of-plane magnetization orientation and switchable by spin torque. The cell includes a ferromagnetic assist layer having low magnetic anisotropy no more than about 500 Oe. The assist layer may have in-plane or out-of-plane anisotropy.

Another particular embodiment of this disclosure is a magnetic memory cell on a substrate. The memory cell has a ferromagnetic free layer having an out-of-plane magnetic anisotropy and an out-of-plane magnetization orientation perpendicular to the substrate and switchable by spin torque. The cell also has a first ferromagnetic pinned reference layer having an out-of-plane magnetic anisotropy and an out-of-plane magnetization orientation perpendicular to the substrate, and an oxide barrier layer between the free layer and the first reference layer. Also includes is a ferromagnetic assist stack proximate the free layer having low magnetic anisotropy, the assist stack comprising an assist layer having a magnetic moment less than about 1000 emu/cc and a magnetization orientation that rotates in a direction of electron flow from a current.

Another particular embodiment of this disclosure is a method of writing to a magnetic cell. The method includes passing a current through magnetic cell comprising a free layer and a reference layer, each having an out-of-plane anisotropy and magnetization orientation, and the current having an electron flow direction. The method includes rotating a magnetization orientation of an assist layer proximate the free layer in the electron flow direction, the assist layer having a magnetic anisotropy no more than about 500 Oe. This results in orienting the magnetization orientation of the free layer in the electron flow direction.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to magnetic stacks or cells (e.g., spin torque memory (STRAM) cells) having perpendicular anisotropy that include a multi-layer assist stack that includes a spin current driven assist layer. In some embodiments, the spin current driven assist layer is generally "in-plane", and is easily switched to "out-of-plane" by the spin current. In other embodiments, the spin current driven assist layer is generally "out-of-plane" as is easily switched to the opposite direction by the spin current.

The present disclosure is directed to various designs of magnetic memory cells having magnetic anisotropies that result in the magnetization orientation of the associated ferromagnetic layers to be aligned perpendicular to the wafer plane, or "out-of-plane". The memory cells have structural elements that reduce the switching current needed to switch the data bit state of the cell while maintaining adequate thermal stability. The memory cells can be patterned on the wafer at a high areal density.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above, "below", etc. may be used in this disclosure. These terms should not be construed as limiting the position or orientation of a structure, but should be used as providing spatial relationship between the structures.

While the present disclosure is not so limited, an appreciation of various aspects of the disclosure will be gained through a discussion of the examples provided below.

Figure 1A:
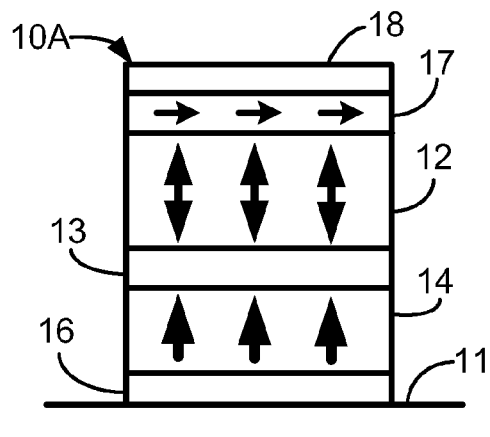
FIG. 1A is a schematic side view diagram of a magnetic cell with out-of-plane magnetization orientation and an assist layer.
Figure 1B:
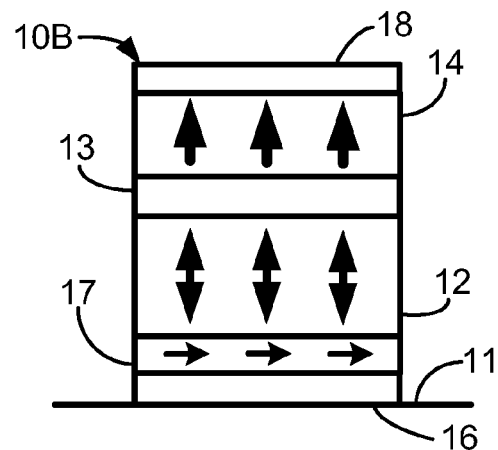
FIG. 1B is schematic side view diagram of an alternate embodiment of the magnetic cell.
Figure 1C:
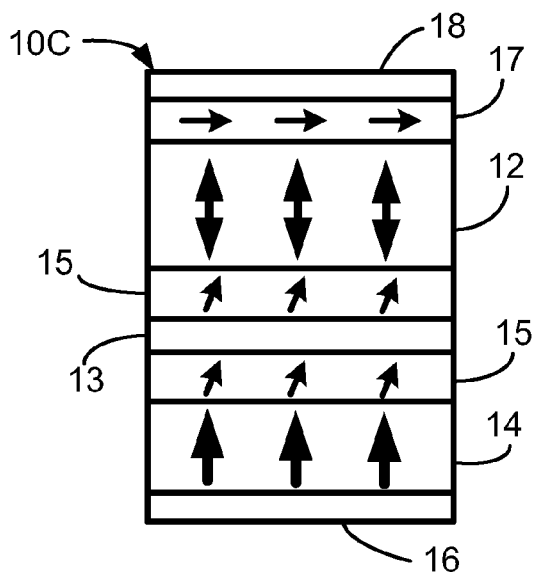
FIG. 1C is schematic side view diagram of another alternate embodiment of the magnetic cell.

FIGS. 1A, 1B and 1C illustrate magnetic stacks having perpendicular or out-of-plane magnetic orientation. In some embodiments, the magnetic stack is a magnetic memory cell and may be referred to as a magnetic tunnel junction cell (MTJ), variable resistive memory cell, variable resistance memory cell, or resistive sense memory (RSM) cell or the like. FIG. 1A shows a memory cell 10A, FIG. 1B shows a memory cell 10B, and FIG. 1C shows a memory cell 10C.

Magnetic memory cells 10A, 10B, 10C have a relatively soft ferromagnetic free layer 12, a ferromagnetic reference (e.g., fixed or pinned) layer 14, each having an out-of-plane anisotropy and magnetization orientation. Ferromagnetic free layer 12 and ferromagnetic reference layer 14 are separated by an oxide barrier layer 13, in some embodiments referred to as a tunnel barrier layer or the like.

FIGS. 1A and 1B illustrate magnetic cell 10A, 10B on a substrate 11, such as a silicon wafer. In memory cell 10A of FIG. 1A, reference layer 14 is closer to substrate 11 than free layer 12. In memory cell 10B of FIG. 1B, free layer 12 is closer to substrate 11 than reference layer 14.

Returning to all of FIGS. 1A, 1B and 1C, free layer 12 and reference layer 14 each have a magnetic anisotropy and an associated magnetization orientation. The anisotropy and magnetization orientations of layers 12, 14 are oriented perpendicular to the layer extension and to the plane of wafer substrate 11 on which memory cell 10A, 10B, 10C is formed, which is often referred to as "out-of-plane" or "perpendicular". The magnetization orientation of free layer 12 is more readily switchable than the magnetization orientation of reference layer 14, which is fixed and generally very low and does not switch. In some embodiments, proximate ferromagnetic reference layer 14 is an antiferromagnetic (AFM) pinning layer that pins the magnetization orientation of reference layer 14 by exchange bias with the antiferromagnetically ordered material of the pinning layer. Examples of suitable pinning materials include PtMn, IrMn, and others. In alternate embodiments, other mechanisms or elements may be used to pin the magnetization orientation of reference layer 14.

Ferromagnetic layers 12, 14 may be made of any useful ferromagnetic (FM) material with perpendicular or out-of-plane anisotropy. There are many configurations of these ferromagnetic and other materials that provide perpendicular magnetic anisotropy, including (1) a single layer of the ferromagnetic material (FM); (2) a ferromagnetic/nonmetallic (FM/NM) multilayer; (3) a FM/FM multilayer; (4) ferromagnetic alloys with particular crystal phase and texture, and (5) heavy rare earth-transition metal alloys. One particular example of a FM/NM multilayer is Co/Pt multilayer. An example of a FM/FM multilayer is Co/Ni multilayer. An example of a ferromagnetic alloy with particular crystal phase and texture is a $CoPt_x$ alloy with hcp crystal structure and a c-axis (easy axis) perpendicular to the film plane.

Another example is FePt with L10 structure and a c-axis perpendicular to the film plane. The same L10 FePt can be made in a FePt multilayer fashion, such as Cr/Pt/FePt. Examples of heavy rare earth-transition metal alloys include TbCoFe and GdCoFe. Examples of other useable materials s include DyFeCo and SmFeCo. In some embodiments, layer 12, 14 have a thickness of about 1-10 nm.

Barrier layer 13 may be made of an electrically insulating material such as, for example an oxide material (e.g., $Al_2O_3$, $TiO_x$ or $MgO_x$). Barrier layer 13 could optionally be patterned with free layer 12 or with reference layer 14, depending on process feasibility and device reliability. In some embodiments, barrier layer 13 has a thickness of about 0.5-1.5 nm.

In the embodiment of FIG. 1C, memory cell 10C includes an enhancement layer 15 present on at least one side of barrier layer 13, in this embodiment, an enhancement layer 15 is present on each side of barrier layer 13, between barrier layer 13 and free layer 12 and between barrier layer 13 and reference layer 14. Enhancement layer 15 is strongly coupled with free layer 12 and/or reference layer 14, thus increasing the magnetoresistance (TMR) of cell 10C and increasing the spin-polarization through cell 10C. For embodiments such as memory cell 10A of FIG. 1A and memory cell 10B of FIG. 1B where reference layer 14 has sufficient spin-polarization and magnetoresistance properties, an enhancement layer is not present.

Enhancement layer 15, if present, can be any ferromagnetic material with acceptable spin polarization range (e.g., greater than about 0.5). Examples of suitable materials include alloys of Fe, Co and/or Ni, such as NiFe, CoFe, and CoFeB. In some embodiments, enhancement layer 15 has a thickness of about 5-30 Å (i.e., 0.5-3 nm).

For embodiments when ferromagnetic materials having an in-plane anisotropy (e.g., alloys of Fe, Co and/or Ni) are used for enhancement layer 15, the magnetization orientation of enhancement layer 15 is canted from "out-of-plane" or "perpendicular" usually no more than about 25 degrees, for example, about 5-20 degrees. The magnetization orientation of enhancement layer 15 is generally in the same direction as the magnetization orientation of free layer 12 or reference layer 14, although slightly canted due to the in-plane anisotropy.

For magnetic stacks according to this disclosure, including magnetic memory cells, a spin current driven or spin polarizing assist layer, having low anisotropy (e.g., about 500 Oe), is included. The anisotropy may be in-plane or out-of-plane. The assist layer facilitates switching of the magnetization orientation of the free layer. In each of FIGS. 1A, 1B and 1C, assist layer 17, which is proximate to free layer 12 and in some embodiments adjacent to free layer 12 with no intervening layers, facilitates the switching of the magnetization orientation of free layer 12. In particular, the magnetic field from the magnetization orientation of assist layer 17 facilitates the switching of the magnetization orientation of free layer 12.

Unlike free layer 12, reference layer 14 and optional enhancement layer 15, assist layer 17 has very weak anisotropy (e.g., no more than about 700 Oe, in some embodiments no more than about 500 Oe or even no more than about 400 Oe), which results in a magnetization orientation that is readily switched. Assist layer 17 is coupled or weakly coupled with free layer 12. Each of FIGS. 1A, 1B and 1C illustrate assist layer 17 with a neutral, in-plane magnetization orientation. Application of a current through magnetic cell 10A, 10B, 10C creates spin torque and affects the magnetization orientation of assist layer 17, which in turn affects the magnetization orientation of free layer 12.

The assist magnetic layer 17 can be any ferromagnetic material with acceptable anisotropy (e.g., no more that about 700 Oe or 500 Oe or 400 Oe), including but not limited to alloys of Co, Ni, Fe, etc. It is preferred that assist layer 17 includes material with a low magnetic moment (Ms), for example, Ms≦1100 emu/cc, in some embodiments Ms≦1000 emu/cc, or even Ms≦950 emu/cc. In some embodiments, assist layer 17 has a thickness of about 5-30 Å (i.e., 0.5-3 nm).

A first electrode 16 and a second electrode are in electrical contact with free layer 12 and with reference layer 14. For memory cell 10A of FIG. 1A and memory cell 10C of FIG. 1C, electrode 16 is proximate (and in some embodiments adjacent to) reference layer 14, whereas for memory cell 10B of FIG. 1B, electrode 16 is proximate (and in some embodiments adjacent to) assist layer 17. For memory cell 10A of FIG. 1A and memory cell 10C of FIG. 1C, electrode 18 is proximate (and in some embodiments adjacent to) assist layer 17, whereas for memory cell 10B of FIG. 1B, electrode 18 is proximate (and in some embodiments adjacent to) reference layer 14. Electrodes 16, 18 electrically connect cells 10A, 10B, 10C to a control circuit providing read and write currents through layers 12, 14. The resistance across magnetic memory cell 10A, 10B, 10C is determined by the relative orientation of the magnetization vectors or magnetization orientations of ferromagnetic layers 12, 14.

All memory cells 10A, 10B, 10C are illustrated with undefined magnetization orientations for free layer 12. The magnetization orientation of free layer 12 has two stable, opposite states, both perpendicular to the substrate on which memory cell 10A, 10B, 10C is formed. A magnetic memory cell is in the low resistance state when the magnetization orientation of free layer 12 is in the same direction as the magnetization orientation of reference layer 14.

Conversely, a magnetic memory cell is in the high resistance state when the magnetization orientation of free layer 12 is in the opposite direction of the magnetization orientation of reference layer 14. In some embodiments, the low resistance state is the "0" data state and the high resistance state is the "1" data state, whereas in other embodiments, the low resistance state is "1" and the high resistance state is "0".

Switching the resistance state and hence the data state of magnetic memory cell 10A, 10B, 10C via spin-transfer occurs when a current, passing through a magnetic layer, such as assist layer 17, becomes spin polarized and imparts a spin torque on free layer 12. When a sufficient spin torque is applied to free layer 12, the magnetization orientation of free layer 12 can be switched between two opposite directions and accordingly, magnetic memory cell 10A, 10B, 10C can be switched between the low resistance state and the high resistance state.

Figure 2:
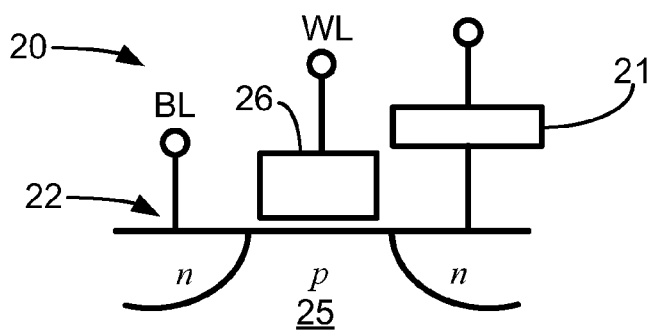
FIG. 2 is a schematic diagram of an illustrative memory unit including a memory cell and a semiconductor transistor.

FIG. 2 is a schematic diagram of an illustrative memory unit 20 including a memory element 21 electrically coupled to a semiconductor transistor 22 via an electrically conducting element. Memory element 21 may be any of the memory cells described herein, or may be any other memory cell configured for switching data states via a current passed through memory element 21. Transistor 22 includes a semiconductor substrate 25 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory element 21. An array of programmable metallization memory units 20 can be formed on a semiconductor substrate with word lines and bit lines utilizing semiconductor fabrication techniques.

For magnetic stacks (e.g., memory cells) having perpendicular magnetic anisotropy, such as memory cells 10A, 10B, 10C a stronger coupling is experienced among the pinned reference layer and the free layer than in magnetic stacks having in-plane magnetic anisotropy. The optional inclusion of an enhancement layer 15 further increases the coupling. The higher coupling results in a lower needed switching current (Ic).

Magnetic stacks with in-plane anisotropy and magnetization requires shape anisotropy to maintain their thermal stability. Shape anisotropy, however, is shape and size dependent and provides a challenge for high capacity and high density memory. Additionally, in-plane magnetic stacks have low efficiency for switching current over thermal stability. The switching current density for an in-plane magnetic stack is:

$$I_c^{P \to AP} = \frac{\alpha M_s V}{\eta}(H_k + 2\pi M_s + H)$$

where, $\alpha$ is the damping constant, $M_s$ is the saturation magnetization, $\eta$ is the spin current efficiency, $H_k$ is the in-plane anisotropy, and $H$ is the external field.

Although the first term ($H_k$) contributes to the thermal stability of the stack, the second term ($2\pi M_s$) has no contribution to the thermal energy but does have a large impact on the needed switching current.

The switching current density for an out-of-plane magnetic stack, with perpendicular anisotropy (e.g., memory cells 10A, 10B), is:

$$I_c^{P \to AP} = \frac{\alpha M_s V}{\eta}(H_k - 4\pi M_s + H)$$

where, $H_k$ is the out-of-plane anisotropy field.

For out-of-plane anisotropy, both the first term ($H_k$) and second term ($-4\pi M_s$) contribute to the thermal stability of the stack. A demagnetization field can further reduce the thermal energy barrier layer and also reduce the needed switching current. At least for these reasons, magnetic stacks with out-of-plane anisotropy have higher efficiency for spin current over thermal stability.

Figure 3:
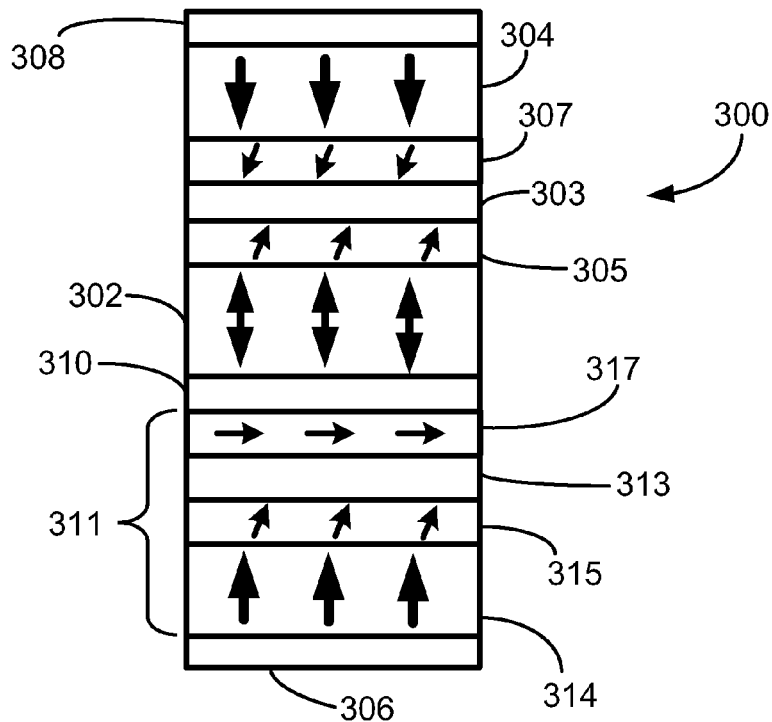
FIG. 3 is a schematic side view diagram of another embodiment of a magnetic cell with out-of-plane magnetization orientation and an assist layer.

FIG. 3 shows an embodiment of a magnetic stack having out-of-plane anisotropy and including an assist layer having weak anisotropy, the assist layer being part of an assist stack. In some embodiments, the assist layer may be the only layer in the assist stack. Features of the various elements of this magnetic stack are similar or the same as the elements of magnetic memory cells 10A, 10B, 10C of FIGS. 1A, 1B and 1C, unless indicated otherwise.

Magnetic cell 300 of FIG. 3 is oriented similar to memory cell 10B of FIG. 1B, with the free layer closer to the substrate on which the memory cell is formed than the reference layer.

Differing from magnetic cell 10B however, magnetic cell 300 has an assist stack, composed of multiple layers, one of which is an assist layer.

Magnetic cell 300 includes a relatively soft ferromagnetic free layer 302, a first ferromagnetic reference (e.g., fixed or pinned) layer 304 with a barrier layer 303 therebetween. Free layer 302 and reference layer 304 each have an out-of-plane magnetization orientation. One either side of barrier layer 303 is an enhancement layer 305, 307, with first enhancement layer 305 proximate free layer 302 and second enhancement layer 307 proximate reference layer 304.

Magnetic cell 300 includes a spin current driven or spin polarizing assist stack 311, separated from free layer 302 by an optional spacer layer 310. In this embodiment, assist stack 311 is composed of a second ferromagnetic reference (e.g., fixed or pinned) layer 314 and a third enhancement layer 315 spaced from an assist layer 317 by a second barrier layer 313. In other embodiments, assist stack 311 may have different layers (additional layers or less layers), but includes assist layer 317. A first electrode 306 is in electrical contact with free layer 302 via assist stack 311 and a second electrode 308 is in electrical contact with reference layer 304.

In some embodiments, magnetic cell 300 may be referred to as a dual cell, having two reference layers (i.e., reference layers 304, 314) with one free layer (i.e., free layer 302). A dual cell structure has a ferromagnetic free layer with a switchable perpendicular magnetization orientation bounded on both its top and bottom by a pinned reference layer.

For magnetic stacks having a dual cell structure, the switching current (Ic) is lower than a single cell structure, due to the two pinned reference layers. Because each pinned reference layer affects the switching of the magnetization orientation of the free layer, the spin torque from the first pinned reference layer and the second pinned reference layer are cumulative, thus requiring less total switching current to switch the magnetization orientation of the free layer.

The various features of free layer 302, barrier layer 303, reference layer 304 and enhancement layers 305, 307 are the same or similar as the features of free layer 12, barrier layer 13, reference layer 14 and enhancement layers 15, 17 of FIGS. 1A, 1B and 1C. Similar to memory cells 10A, 10B, 10C of FIGS. 1A, 1B and 1C, free layer 302 and reference layer 304 have an out-of-plane or perpendicular anisotropy and magnetization orientation, and enhancement layers 305, 307 have a predominantly out-of-plane or perpendicular magnetization orientation. The magnetization orientation of free layer 302 has two stable, opposite states, both with perpendicular to the substrate on which magnetic cell 300 is formed. The magnetization orientation of enhancement layers 305, 307 also two stable, opposite states, both slightly canted in relation to the substrate. Enhancement layer 307 proximate reference layer 304 has a magnetization orientation generally parallel to, yet slightly canted, in relation to the magnetization orientation of reference layer 304.

Enhancement layer 305, closer to free layer 302 than second enhancement layer 307, has a magnetization orientation that switches based on the magnetization orientation of free layer 302; the magnetization orientation may be either parallel or anti-parallel to that of enhancement layer 307.

Assist stack 311 has reference layer 314 have an out-of-plane or perpendicular anisotropy and magnetization orientation, and enhancement layer 315 has a predominantly out-of-plane or perpendicular magnetization orientation. As a dual cell structure, reference layer 314 has a magnetization orientation opposite or anti-parallel to the magnetization orientation of first reference layer 304. The magnetization orientation of enhancement layer 315 has two stable, opposite states, both slightly canted in relation to the substrate on which magnetic cell 300 is formed. Enhancement layer 317 proximate reference layer 314 has a magnetization orientation generally parallel to, yet slightly canted, in relation to the magnetization orientation of reference layer 314. Assist layer 317 has weak anisotropy, either in-plane or out-of-plane, which is easily switchable.

In the specific embodiment of magnetic cell 300, separating assist stack 311 from free layer 302 is spacer 310, which is either a conductive non-ferromagnetic material such as Ru, Pd or Cr or an electrical insulator having a thickness less than 1.5 nm. In some embodiments, for example, those where direct coupling between assist layer 307 and free layer 302 is desired, no spacer layer is present.

Assist stack 311, which includes spin current polarized assist layer 317, facilitates the switching of the magnetization orientation of free layer 302. In particular, the magnetic field from the magnetization orientation of assist layer 317 facilitates the switching of the magnetization orientation of free layer 302.

Unlike free layer 302, reference layers 304, 314 and enhancement layers 305, 307, 315, assist layer 317 has weak or very weak anisotropy, which is readily switchable. The anisotropy may be in-plane or out-of-plane. Assist layer 317 is coupled or weakly coupled with free layer 302. FIG. 3 illustrates assist layer 317 with a neutral, in-plane magnetization orientation. Application of a current through magnetic cell 300 creates spin torque that affects the magnetization orientation of assist layer 317 which in turn affects the magnetization orientation of free layer 302.

Figure 4A:
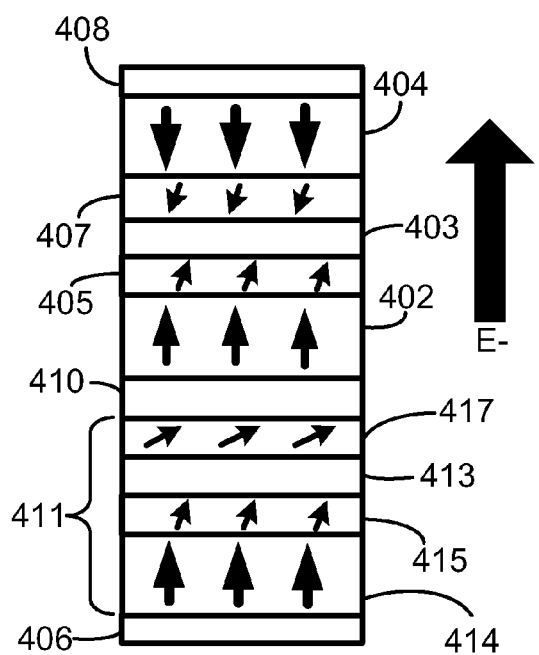
FIG. 4A is a schematic side view diagram of a magnetic cell having an assist layer, the stack in a high resistance state.
Figure 4B:
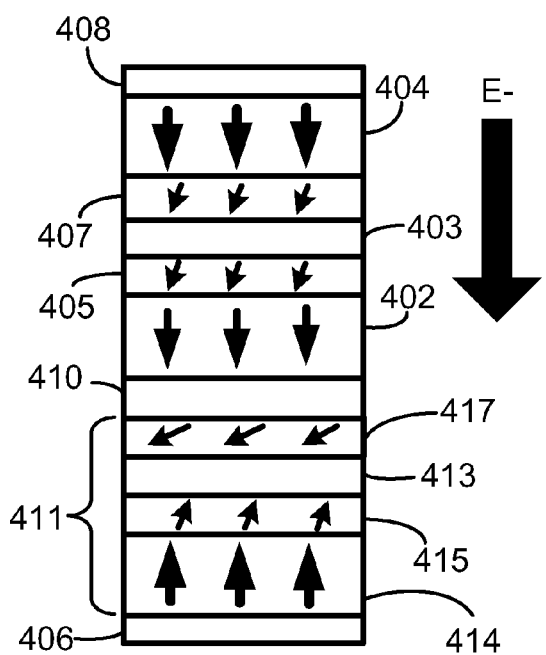
FIG. 4B is a schematic side view diagram of the magnetic cell in a low resistance state.

Referring to FIGS. 4A and 4B, a magnetic stack similar to magnetic cell 300 of FIG. 3 is illustrated. Magnetic cell 400 includes a relatively soft ferromagnetic free layer 402 and a first ferromagnetic reference (e.g., fixed or pinned) layer 404, each having an out-of-plane magnetization orientation. Between free layer 402 and first reference layer 404 are a first barrier layer 403, a first enhancement layer 405, and a second enhancement layer 407. An assist stack 411 is proximate free layer 402 on the opposite side of reference layer 404, separated from free layer 402 by an optional spacer layer 410. Assist stack 411 has a second reference layer 414, a third enhancement layer 415 and an assist layer 417, with a second barrier layer 413 between enhancement layer 415 and assist layer 417. Of the various layers of stack 411, assist layer 417 is closest to free layer 402. A first electrode 406 is in electrical contact with free layer 402 via assist stack 411 and a second electrode 408 is in electrical contact with first reference layer 404.

Spin torque through magnetic cell 400 easily changes the magnetization orientation of assist layer 417 either up (i.e., in the same direction as the magnetization orientation of second reference layer 414) or down (i.e., in the same direction as the magnetization orientation of first reference layer 404) depending on the electron flow direction. Prior to application of any current and electron flow, the magnetization orientation of assist layer 417 may be in-plane or out-of-plane. If in-plane, in most embodiments, the magnetization orientation of assist layer 417 will rotate from in-plane toward out-of-plane with the electron flow, usually at least 10 degrees from in-plane, in some embodiments at least 25 degrees from in-plane.

FIG. 4A illustrates electrons flowing upward from second reference layer 414 to first reference layer 404 and FIG. 4B illustrates electrons flowing downward from first reference layer 404 to second reference layer 414. Due to its low anisotropy, as spin polarized electrons flow from bottom to top in FIG. 4A, the magnetization orientation of assist layer 417 rotates with the electrons. The upward oriented assist layer 417 emits an assistant magnetic field (i.e., a static field, interlayer coupling field or both). The assistant magnetic field affects the switching of the magnetization of free layer 402. The resulting structure is in a high resistance state, with the magnetization orientation of free layer 402 in the opposite direction as (i.e., anti-parallel to) the magnetization orientation of first reference layer 404. As spin polarized electrons flow from top to bottom in FIG. 4B, the magnetization orientation of assist layer 417 rotates with the electrons. The downward oriented assist layer 417 emits an assistant magnetic field (i.e., a static field, interlayer coupling field or both) that affects the switching of the magnetization of free layer 402. The resulting structure is in a low resistance state, with the magnetization orientation of free layer 402 in the same direction as (i.e., parallel to) the magnetization orientation of reference layer 404.

Thus, to write the low resistant state to memory cell 400 (FIG. 4B), current would be applied across memory cell 400 from electrode 406 to electrode 408, so that electrons flow downward. Conversely, the write the high resistant state to memory cell 400 (FIG. 4A), current would be applied across memory cell 400 from electrode 408 to electrode 406, so that electrons flow upward.

The various structures of this disclosure may be made by thin film techniques such as chemical vapor deposition (CVD), physical vapor deposition (PVD), sputter deposition, and atomic layer deposition (ALD).

Thus, embodiments of the MAGNETIC STACK HAVING ASSIST LAYER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a device, system or apparatus. For example, if a device includes a first layer, it should not be implied that a second layer is required in that device.

What is claimed is:

1. A magnetic cell comprising:
   a ferromagnetic free layer and a first ferromagnetic pinned reference layer, each having an out-of-plane magnetic anisotropy and an out-of-plane magnetization orientation and switchable by spin torque;
   a first oxide barrier layer between the free layer and the reference layer; and
   a ferromagnetic assist layer having low magnetic anisotropy less than 500 Oe proximate the free layer.

2. The magnetic cell of claim 1 wherein the assist layer has in-plane magnetic anisotropy.

3. The magnetic cell of claim 1 wherein the assist layer has out-of-plane magnetic anisotropy.

4. The magnetic cell of claim 1 wherein the assist layer comprises at least one of Co, Ni, Fe or an alloy thereof.

5. The magnetic cell of claim 1 wherein the assist layer has a magnetic moment of less than about 1000 emu/cc.

6. The magnetic cell of claim 1 further comprising a second pinned reference layer having an out-of-plane magnetic anisotropy and an out-of-plane magnetization orientation, the assist layer positioned between the free layer and the second reference layer.

7. The magnetic cell of claim 6 further comprising a first enhancement layer and a second enhancement layer, the first enhancement layer between the oxide barrier layer and the free layer and the second enhancement layer between the oxide barrier layer and the first reference layer.

8. The magnetic cell of claim 7 further comprising a third enhancement layer proximate the second reference layer.

9. The magnetic cell of claim 8 further comprising a second oxide barrier layer between the assist layer and the third enhancement layer.

10. The magnetic cell of claim 6 comprising a conductive non-ferromagnetic spacer layer between the assist layer and the free layer.

11. The magnetic cell of claim 6 comprising an electrically insulative spacer layer between the assist layer and the free layer.

12. The magnetic cell of claim 6 wherein upon passage of a current through the magnetic cell, the magnetization orientation of the assist layer is at least 10 degrees from in-plane.

13. The magnetic cell of claim 6 wherein the magnetic cell is a magnetic tunnel junction memory cell.

14. A magnetic memory cell on a substrate, the memory cell comprising:
    a ferromagnetic free layer having an out-of-plane magnetic anisotropy and an out-of-plane magnetization orientation perpendicular to the substrate and switchable by spin torque;
    a first ferromagnetic pinned reference layer having an out-of-plane magnetic anisotropy and an out-of-plane magnetization orientation perpendicular to the substrate;
    an oxide barrier layer between the free layer and the first reference layer; and
    a ferromagnetic assist stack proximate the free layer having low magnetic anisotropy, the assist stack comprising an assist layer having a magnetic moment less than 1000 emu/cc and a magnetization orientation that rotates in a direction of electron flow from a current.

15. The memory cell of claim 14 wherein the assist layer has in-plane magnetic anisotropy.

16. The memory cell of claim 15 wherein the magnetization orientation of the assist layer is at least 10 degrees from in-plane.

17. The memory cell of claim 14 wherein the assist layer has a low magnetic anisotropy less than about 500 Oe.

18. A method of writing to a magnetic cell comprising:
    passing a current through a magnetic cell comprising a free layer and a reference layer, each having an out-of-plane anisotropy and magnetization orientation, the current having an electron flow direction;
    rotating a magnetization orientation of an assist layer proximate the free layer in the electron flow direction, the assist layer having a magnetic anisotropy less than 500 Oe; and
    orienting the magnetization orientation of the free layer in the electron flow direction.

19. The method of claim 18 further comprising:
    passing the current through a second reference layer having an out-of-plane anisotropy and magnetization orientation.

20. The method of claim 18 wherein rotating a magnetization orientation of an assist layer comprises rotating the magnetization orientation at least 10 degrees from in-plane.

* * * * *